Figure 1:
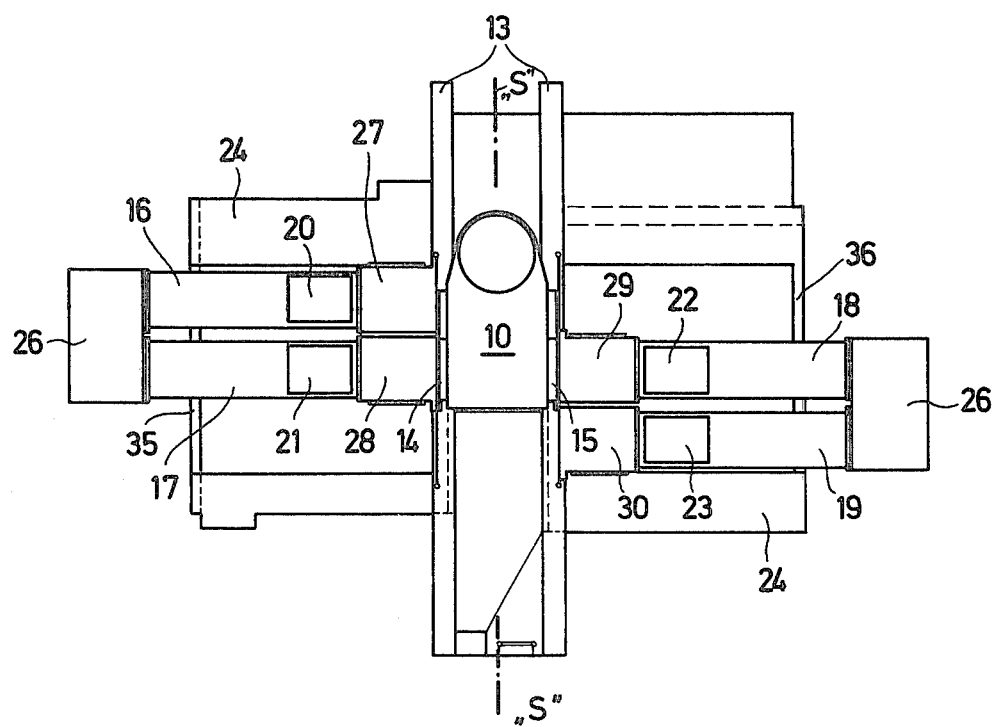

United States Patent [19]
Aichert et al.

[11] 4,184,448
[45] Jan. 22, 1980

[54] VACUUM COATING APPARATUS HAVING A PLURALITY OF LOCK CHAMBERS

[75] Inventors: Hans Aichert; Walter Dietrich, both of Hanau am Main; Alfred Hauff; Herbert Stephan, both of Bruchköbel; Friedrich Stark, Langenselbold, all of Fed. Rep. of Germany

[73] Assignee: Leybold-Heraeus GmbH, Cologne, Fed. Rep. of Germany

[21] Appl. No.: 963,062

[22] Filed: Nov. 22, 1978

[30] Foreign Application Priority Data

Mar. 21, 1978 [DE] Fed. Rep. of Germany ....... 2812271

[51] Int. Cl.² ............................................ C23C 13/08
[52] U.S. Cl. ................................... 118/729; 118/733; 118/50; 118/50.1; 414/217; 414/287; 427/35; 427/38; 427/42; 427/250; 427/294; 427/295; 34/242
[58] Field of Search ................ 118/48, 49, 49.1, 49.5, 118/50, 50.1; 414/217, 152, 156, 287, 198; 34/242; 427/35, 38, 42, 294, 295, 250

[56] References Cited

U.S. PATENT DOCUMENTS

| | | | |
|---|---|---|---|
| 2,658,633 | 11/1953 | Holcroft | 414/156 |
| 3,584,847 | 6/1971 | Hammond et al. | 118/48 X |
| 3,620,956 | 11/1971 | Gauger | 204/192 R X |
| 3,656,454 | 4/1972 | Schrader | 118/49 |
| 3,756,435 | 9/1973 | Steigerwald | 414/217 |
| 3,871,394 | 3/1975 | Thegerstrom | 134/46 |
| 3,931,789 | 1/1976 | Kakei | 118/49 |
| 3,981,791 | 9/1976 | Rosvold | 118/50 X |
| 4,015,558 | 4/1977 | Small et al. | 118/49.1 X |
| 4,042,128 | 8/1977 | Schrader | 118/49 X |

*Primary Examiner*—Edward C. Kimlin
*Attorney, Agent, or Firm*—Sprung, Felfe, Horn, Lynch & Kramer

[57] ABSTRACT

Apparatus for batch coating of substrates under vacuum including a vacuum chamber with a coating system and a plurality of lock chambers with substrate holders which can be introduced into the vacuum chamber. At least two lock chambers with substrate holders are positioned on a common axis on opposite sides of the vacuum chamber. Each lock chamber is provided on the side facing the vacuum chamber with a lock valve. The vacuum chamber is likewise provided with lock valves on the sides facing the lock chambers whereby the lock chambers can be coupled selectively with the vacuum chamber through the individual lock valves.

6 Claims, 3 Drawing Figures

VACUUM COATING APPARATUS HAVING A PLURALITY OF LOCK CHAMBERS

BACKGROUND

This invention relates to apparatus for the batch-wise coating of substrates under a vacuum having a vacuum chamber with a coating system and a plurality of lock chambers with substrate holders which can be introduced into the vacuum chamber.

In the batch-wise operation of discontinuously functioning vacuum coating apparatus, a certain amount of time is always lost in the passage of the batches through lock chambers, since the vacuum chamber cannot be used for coating during that time. This is of secondary importance as long as the coating procedure takes several times longer than the charging operation. As the output of vacuum coating apparatus, such as electron beam evaporators, for example, increases, the time required for the coating procedure can be considerably reduced, so that it becomes increasingly desirable to reduce the time required for the loading of the apparatus. The delay involved in this operation becomes more disadvantageous when the coating process is preceded by a time-consuming preliminary treatment, such as, for example, a glow discharge treatment for purification purposes or a heating of the substrates, if these operations are not performed in the vacuum chamber itself.

SUMMARY

This invention provides apparatus of the above-mentioned kind having a considerably improved economy, so that a virtually uninterrupted batch-wise operation is possible.

This is accomplished in accordance with the invention by providing at least two lock chambers with substrate holders disposed on a common chassis on opposite sides of the vacuum chamber. Each lock chamber is provided with a lock valve on the side facing the vacuum chamber and the vacuum chamber is likewise provided with lock valves on the sides facing the lock chambers. In this way the lock chambers can be coupled alternatively to the vacuum chamber by means of the lock valves.

DESCRIPTION

By the above-specified measures it is possible, in the case of a loading and preliminary treatment time of, for example, 16 minutes, to continuously load a vacuum depositing apparatus in which the coating procedure takes, for example, four minutes. In this case it is sufficient to provide two lock chambers on each side of the vacuum chamber, coupling them alternatively to the vacuum chamber.

The apparatus of the invention can be used to special advantage in the vacuum depositing of corrosion-resistant and oxidation-resistant surface coatings on gas turbine blades. Such processes are described, for example, in a publication by Chromalloy American Corporation, New York, entitled "High Temperature Resistant Coatings for Supper-alloy," by Seelig et al. To achieve a sufficient strength of adhesion of the surface coating by intermetallic diffusion, it is necessary to keep the turbine blades at a temperature of about 1000° C. during the vacuum depositing procedure. To avoid occupying the vacuum chamber for the period of time required for the heating of the turbine blades and free it for the actual vacuum coating procedure, the turbine blades are preheated outside of the vacuum chamber used for the coating. This is advantageous because the turbine blades have a relatively great thermal inertia and must not be heated too rapidly, so as to avoid the occurrence of unacceptably high thermal tensions. In one especially advantageous embodiment of the invention, a preliminary treatment chamber is associated with each lock chamber and is designed as a heating chamber. On the basis of the multiple arrangement of these preliminary treatment chambers and lock chambers, it is possible to perform the heating over a relatively long period of time and to introduce the turbine blades at the required temperature into the vacuum chamber for the coating procedure. It is therefore possible to have always ready a sufficiently great number of preheated substrates, whose coating can start immediately after their introduction to the vacuum chamber.

An embodiment of the invention and the operation thereof will be described with the aid of FIGS. 1, 2 and 3.

Figure 2:
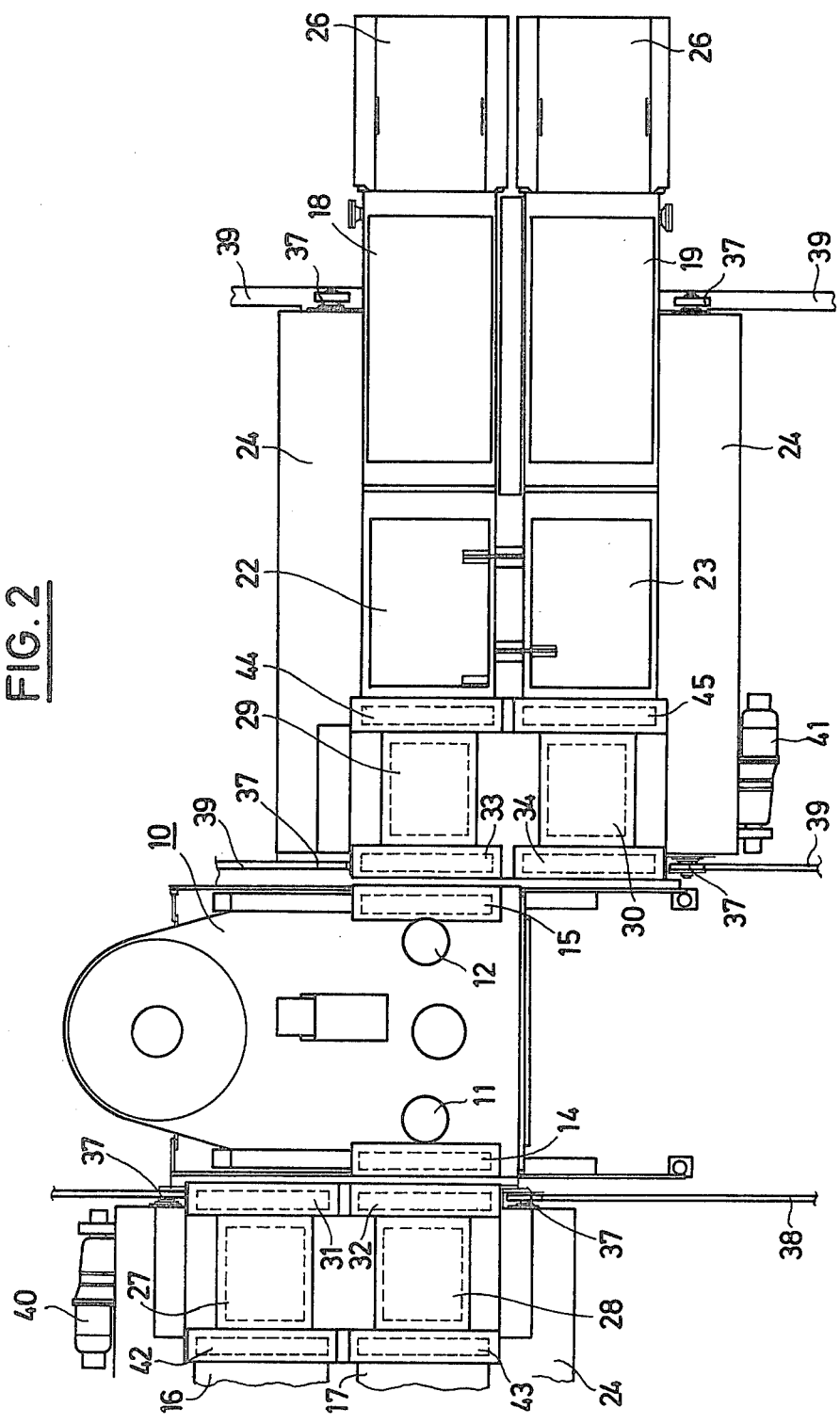
Figure 3:
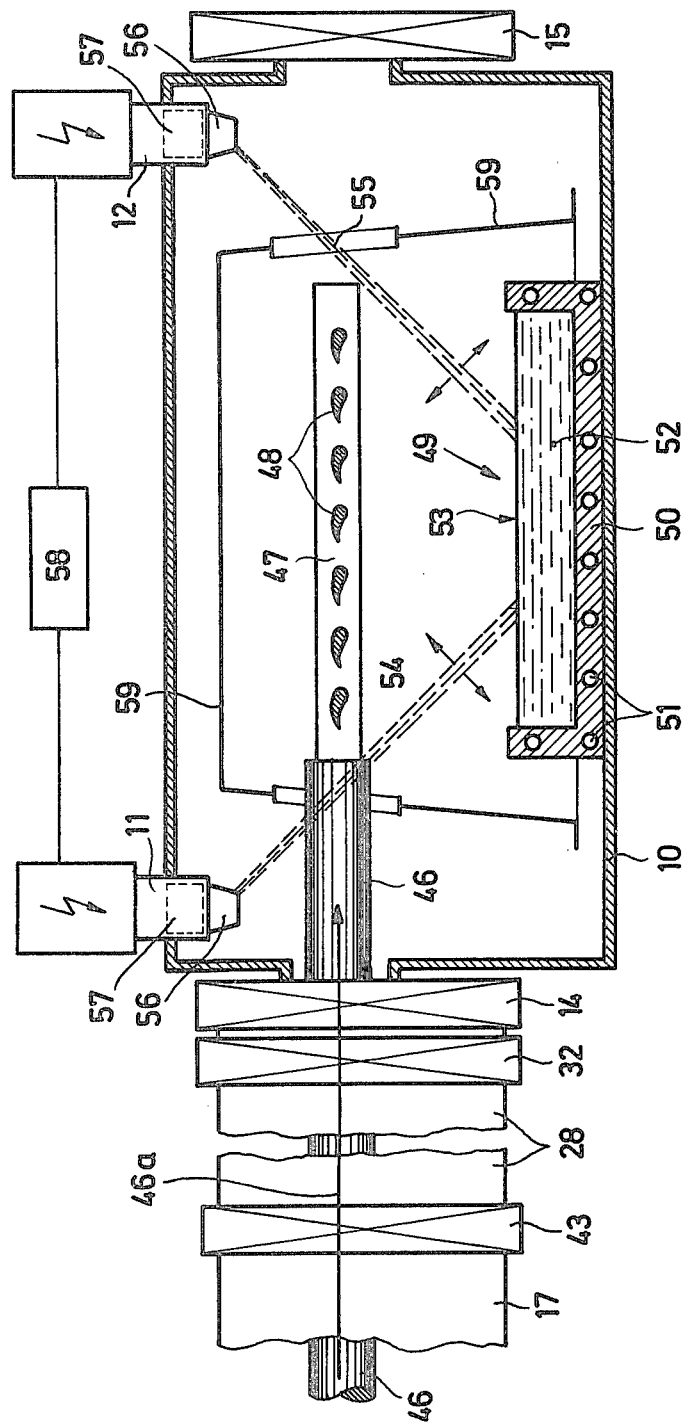

FIG. 1 is a diagrammatic top plan view of a complete apparatus havin two lock chambers on each side of the vacuum chamber, FIG. 2 is an enlarged detail of a portion of FIG. 1, and FIG. 3 is a vertical cross sectional view taken through the vacuum chamber with vacuum coating system.

In the figures there is represented a vacuum chamber 10 which is provided with a vacuum coating system using electron beam heating. Of the coating system only the two electron guns 11 and 12 are visible in FIG. 2. The vacuum chamber 10 is disposed fixedly on a supporting framework 13, and has lock valves 14 and 15 of conventional construction on its sides. Such lock valves can be in the form, for example, of vacuum slide valves.

On the left side of the vacuum chamber 10 there are disposed two lock chambers 16 and 17. On the other side, in a mirror-image arrangement, are two more lock chambers 18 and 19, the long axes of all lock chambers being aligned perpendicularly to a plane of symmetry S passing through the vacuum chamber 10. The lock chambers are provided at the top with loading openings 20, 21, 22 and 23, which can be closed by covers. The tops of the lock chambers, with the loading openings, are situated adjacent a work platform 24 so that the loading openings can be conveniently served from above. In the lock chambers 16 to 19 are substrate holders 47 (FIG. 3), each connected to a drive which permits horizontal movement of the substrates from the loading openings all the way into the vacuum chamber 10. These drives are situated in separate drive chambers 26 located at the outside ends of the lock chambers. Between the lock chambers and the vacuum chamber 10 are preliminary treatment chambers 27, 28, 29 and 30, which are affixed to the lock chambers 16, 17, 18, 19, respectively. At the ends facing the vacuum chamber 10, the preliminary treatment chambers are provided with lock valves 31, 32, 33 and 34 (FIG. 2). Lock valves 31 and 32 can be coupled to the lock valve 14 of vacuum chamber 10, while lock valves 33 and 34 can be coupled to the lock valve 15 of vacuum chamber 10.

The lock chambers 16 and 17 are disposed on a common chassis which can run on rails extending parallel to the plane of symmetry S. In like manner, the lock chambers 18 and 19 are disposed on a common chassis which likewise can travel parallel to the plane of symmetry S.

The chassis, of which only the upper frame parts are visible in FIG. 1, are designated as 35 and 36. As shown in FIG. 2, these chassis are provided at the bottom with wheels 37 rolling on pairs of rails 38 and 39. A gear motor 40 and 41 serves for the drive of each of the chassis 35 and 36.

In FIG. 2, there are situated between the lock chambers 16–19 and the preliminary treatment chambers 27–30 additional lock valves 42–45 which make it possible to keep the preliminary treatment chambers 27–30 under vacuum even when the loading openings 20–23 are open. If the preliminary treatment chambers are in the form of heating chambers, this not only makes it possible to maintain the temperature better, but also protects the fittings in the heating chambers against oxidation by the ambient air.

In FIGS. 1 and 2, the left chassis 35 with the lock chambers 16 and 17 is in the rear position, while chassis 36 with the lock chambers 18 and 19 is in the front position. By shifting the chassis by the distance between centers of the lock chambers, the chassis 35 can be set in the same position on the left side of the vacuum chamber as on the right side, but in a mirror-image relationship and vice versa.

The cooperation of each lock chamber with the preliminary treatment chamber will be further explained with the aid of FIG. 3, which shows a cross section through the vacuum chamber, the plane of section being situated such that the vertical axes of the two electron guns 11 and 12 are situated in the section plane. The lock chamber 17 with preliminary treatment chamber 28 is communicated with the vacuum chamber 10 by the fact that the lock valves 14 and 32 are coupled together hermetically. The two lock valves are open, and so is the lock valve 43.

A holding rod 46, on the end of which there is disposed a substrate holder 47 bearing several substrates 48, extends all the way through all of the lock valves. The holding rod 46 is movable in the direction of the arrow 46a and is connected to a drive, which is not shown, and which is situated in the drive chamber 26 (FIG. 1). Each of the lock chambers 16 to 19 has the same construction and the same equipment.

Underneath the substrate holder 47, in the vacuum chamber 10, there is provided a coating system 49 which in the present case consists of an evaporating crucible 50 with cooling passages 51. A molten bath 52 of the material to be evaporated is contained in the evaporating crucible. The bath 52 has a surface 53 which is struck by two electron beams 54 and 55 which are produced in the electron guns 11 and 12. The bath surface is scanned by means of the X-axis deflecton systems 56 and Y-axis deflection systems 57 according to a certain pattern as described in copending application Ser. No. 963,236 filed Nov. 22, 1978. A control system 58 supplies the electron guns 11 and 12 with the necessary deflection voltages for the individual deflection systems. Under the effect of the electron beams a cloud of vapor arises from the bath surface 53 and condenses partially on the substrates 48, producing surface coatings thereon. For the maintenance of a definite temperature level in the area of the substrates the entire system is surrounded by a heat reflector 59.

As soon as the coating on the substrates 48 has the required characteristics, the holding rod 46 is withdrawn in the direction opposite that of the arrow 46a until the substrates 48 are within the lock chamber 17. The lock valves 14, 32 and 43 are then closed. Then the lock chambers 17 with preliminary treatment chamber 28 are moved horizontally until another lock chamber is aligned with the vacuum chamber. Then the action can be repeated. The lock chambers situated on the other side of the vacuum chamber, which cooperate with the lock valve 15, have been omitted for the sake of simplicity.

What is claimed is:

1. Apparatus for the batch-wise coating of substrates under vacuum comprising vacuum chamber means with a coating system and a plurality of lock chamber means with substrate holder means which can be introduced into the vacuum chamber means, at least two lock chamber means with substrate holder means being positioned on common chassis means on opposite sides of the vacuum chamber means, means for movably mounting the common chassis means to align each lock chamber means with the vacuum chamber means, each lock chamber means being provided on the side facing the vacuum chamber means with lock valve means, said vacuum chamber means being likewise provided with lock valve means on the sides facing the lock chamber means whereby the lock chamber means can be coupled selectively with the vacuum chamber means through the individual lock valve means.

2. Apparatus of claim 1 wherein two lock chamber means are disposed on each side of the vacuum chamber means.

3. Apparatus of claim 1 wherein, between each lock chamber means and the vacuum chamber means there is positioned preliminary treatment chamber means which can be made to travel with the lock chamber means.

4. Apparatus of claim 1 wherein work platform means are positioned adjacent the tops of the lock chamber means and charging openings are provided in said tops.

5. Apparatus of claim 3 wherein lock valve means are positioned between the lock chamber means and the preliminary treatment chamber means.

6. Apparatus of claim 1 wherein the coating system has a substantially rectangular cross section, the substrates are fastenable to the substrate holder means in a substantially rectangular array, and the substrate holder means can be moved out of all lock chamber means into the same position above the apparatus such that the long axes of the apparatus and of the substrate array lie in one vertical plane.

* * * * *